United States Patent
Sunwoo et al.

(10) Patent No.: US 10,409,515 B2
(45) Date of Patent: Sep. 10, 2019

(54) NONVOLATILE MEMORY DEVICE FOR PERFORMING AT LEAST ONE OF RANDOMIZATION OPERATION AND ERROR CORRECTION OPERATION

(71) Applicant: Samsung Electronics Co., Ltd., Suwon-si, Gyeonggi-do (KR)

(72) Inventors: Jung Sunwoo, Seoul (KR); Makoto Hirano, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 277 days.

(21) Appl. No.: 15/401,294

(22) Filed: Jan. 9, 2017

(65) Prior Publication Data

US 2017/0293449 A1  Oct. 12, 2017

(30) Foreign Application Priority Data

Apr. 7, 2016  (KR) .................. 10-2016-0042806

(51) Int. Cl.
| | |
|---|---|
| *G06F 3/06* | (2006.01) |
| *G11C 29/52* | (2006.01) |
| *G06F 11/10* | (2006.01) |
| *G11C 29/04* | (2006.01) |

(52) U.S. Cl.
CPC .......... *G06F 3/0638* (2013.01); *G06F 3/0619* (2013.01); *G06F 3/0656* (2013.01); *G06F 3/0679* (2013.01); *G06F 11/1068* (2013.01); *G11C 29/52* (2013.01); *G11C 2029/0409* (2013.01)

(58) Field of Classification Search
CPC .... G06F 3/0619; G06F 3/0638; G06F 3/0656; G06F 3/0679; G06F 11/1068; G11C 29/52; G11C 2029/0409
See application file for complete search history.

(56) References Cited

U.S. PATENT DOCUMENTS

| | | | |
|---|---|---|---|
| 7,653,760 | B2 | 1/2010 | Maruyama |
| 8,339,854 | B2 | 12/2012 | Yoon |
| 8,581,622 | B1 | 11/2013 | Ikeda et al. |
| 8,694,720 | B2 | 4/2014 | Lee et al. |

(Continued)

FOREIGN PATENT DOCUMENTS

| | | |
|---|---|---|
| JP | 2009147536 | 7/2009 |
| JP | 2009157836 | 7/2009 |

(Continued)

*Primary Examiner* — Christian M Dorman
(74) *Attorney, Agent, or Firm* — Onello & Mello, LLP.

(57) ABSTRACT

A nonvolatile memory device includes a memory cell array including a plurality of first segments having a write data, and a plurality of second segments having a programmed information defining a programmed segment from the plurality of first segments. A randomizer is configured to randomize the write data. An error correction circuit is configured to perform an error correction operation on the write data. A control logic is configured to determine the programmed information from an address received from a memory controller, and to determine whether to operate the randomizer and the error correction circuit based on the determination of the programmed information during the program operation. A page buffer is configured to store the write data and the programmed information during the randomizing and the error correction operation.

19 Claims, 16 Drawing Sheets

(56) References Cited

U.S. PATENT DOCUMENTS

| | | | |
|---|---|---|---|
| 8,751,900 | B2 | 6/2014 | Kim et al. |
| 8,773,922 | B2 | 7/2014 | Song et al. |
| 8,799,593 | B2 | 8/2014 | Chung et al. |
| 8,812,933 | B2 | 8/2014 | Joo et al. |
| 8,874,934 | B2 | 10/2014 | Park et al. |
| 9,128,623 | B2 | 9/2015 | Mun et al. |
| 9,136,002 | B2 | 9/2015 | Lee et al. |
| 2012/0215963 | A1 | 8/2012 | Kim et al. |
| 2013/0148436 | A1 | 6/2013 | Kurosawa |
| 2013/0281173 | A1 | 10/2013 | Gilson et al. |
| 2014/0126285 | A1 | 5/2014 | Kang |
| 2014/0258597 | A1 | 9/2014 | Kim et al. |
| 2014/0313835 | A1 * | 10/2014 | Lee ................ G11C 16/10 365/185.18 |
| 2015/0121168 | A1 | 4/2015 | Kim |
| 2015/0154067 | A1 | 6/2015 | Rho |

FOREIGN PATENT DOCUMENTS

| | | |
|---|---|---|
| KR | 20110125892 | 11/2011 |
| KR | 20120105854 | 9/2012 |
| KR | 101504338 | 3/2015 |

\* cited by examiner

FIG. 4
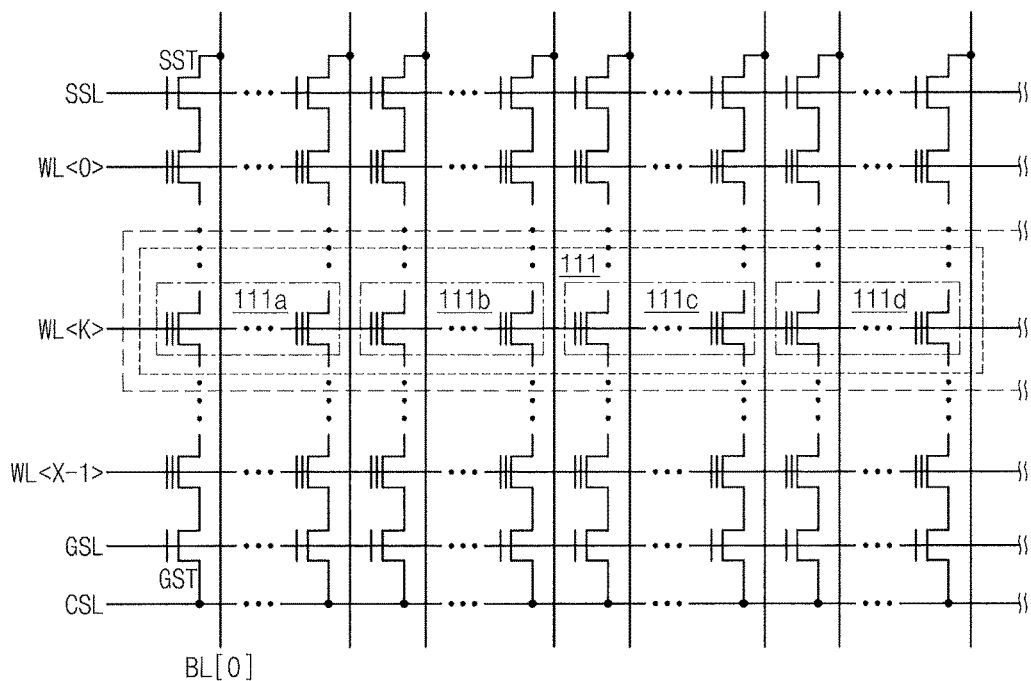
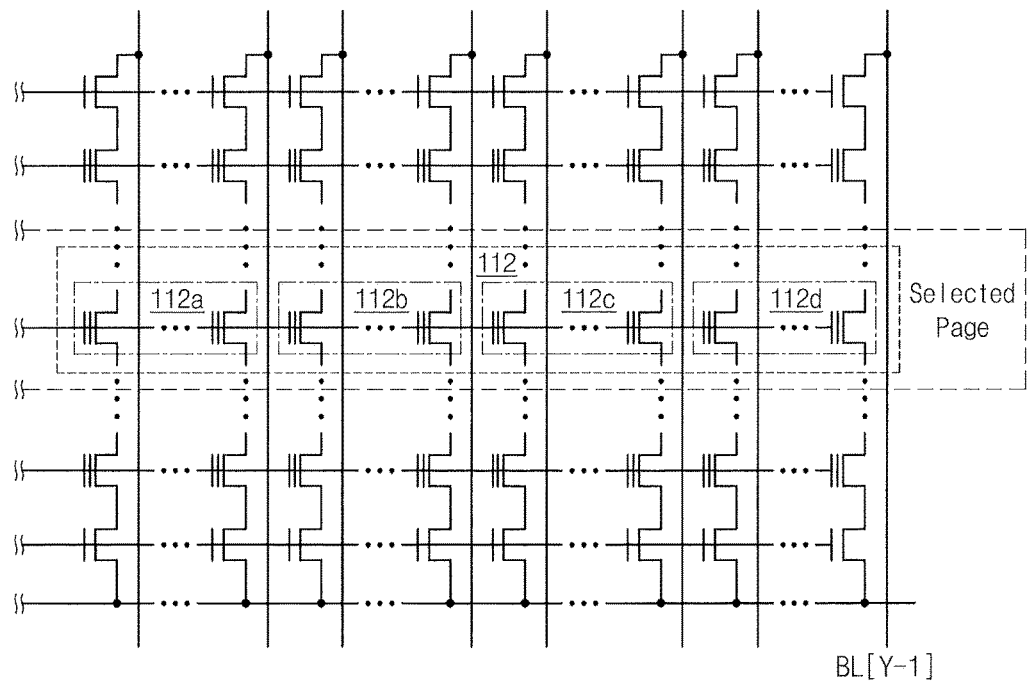

NONVOLATILE MEMORY DEVICE FOR PERFORMING AT LEAST ONE OF RANDOMIZATION OPERATION AND ERROR CORRECTION OPERATION

CROSS-REFERENCE TO RELATED APPLICATION

This application claims priority under 35 U.S.C. § 119 is from Korean Patent Application No. 10-2016-0042806 filed on Apr. 7, 2016, the disclosure of which is hereby incorporated by reference in its entirety.

BACKGROUND

Embodiments of the inventive concept described herein relate to a nonvolatile memory device, and more particularly, to a nonvolatile memory device that performs a randomization operation.

A nonvolatile memory device retains data stored therein regardless of whether power is supplied to the device. A flash memory device is one example of the nonvolatile semiconductor memory device. The flash memory device is frequently used as a storage medium for information devices such as a computer, a cellular phone, a smartphone, a digital camera, a camcorder, a voice recorder, an MP3 player, a personal digital assistant (PDA), a handheld PC, a game console, a facsimile, a scanner, and a printer.

The nonvolatile memory device may include an on-chip randomizer or an on-chip error correction circuit. Either a randomizer or an error correction circuit may be integrated together on the same chip (e.g., integrated circuit) with the nonvolatile memory device. The randomizer may randomize write data to be stored in the nonvolatile memory device. The error correction circuit may correct an error of data stored in the nonvolatile memory device by using an error correction code.

The nonvolatile memory device may be mounted on a mobile device such as a smartphone. Accordingly, there is a need to improve an operating speed or reduce a power consumption by controlling the on-chip randomizer or the on-chip error correction circuit.

SUMMARY

Embodiments of the inventive concept provide for a nonvolatile memory device that performs a randomization operation having high-speed and low-power characteristics.

In one aspect, the present inventive concepts are directed to a nonvolatile memory device comprising a memory cell array including a plurality of first segments having a write data, and a plurality of second segments having a programmed information defining a programmed segment from the plurality of first segments. A randomizer is configured to randomize the write data. An error correction circuit is configured to perform an error correction operation on the write data.

A control logic is configured to determine the programmed information from an address received from a memory controller, and to determine whether to operate the randomizer and the error correction circuit based on the determination of the programmed information during a program operation. A page buffer is configured to store the write data and the programmed information during the randomizing and the error correction operation.

In another aspect, the present inventive concepts are directed to a nonvolatile memory device comprising a memory cell array including a plurality of first segments having a write data, and a plurality of second segments having a programmed information defining a programmed segment from the plurality of first segments. A control logic is configured to determine whether a randomization operation is performed on the write data in units of a first segment, based on an address received from a memory controller during a program operation and to determine whether a de-randomization operation is performed on a read data retrieved from the plurality of first segments in units of the first segment, based on the information programmed in the plurality of second segments during a read operation.

In another aspect, the present inventive concepts are directed to a nonvolatile memory device comprising a memory cell array including a plurality of first segments having a write data, and a plurality of second segments having a programmed information defining a programmed segment from the plurality of first segments. A control logic is configured to determine whether an error correction operation is performed on the write data in units of a first segment, based on an address received from a memory controller during a program operation and to determine whether an error correction operation is performed on a read data retrieved from the plurality of first segments in units of the first segment, based on the information programmed in the plurality of second segments during a read operation.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which:

FIG. 3 and FIG. 4 are schematic views of embodiments of a memory cell array.

DETAILED DESCRIPTION OF EMBODIMENTS

Figure 1:
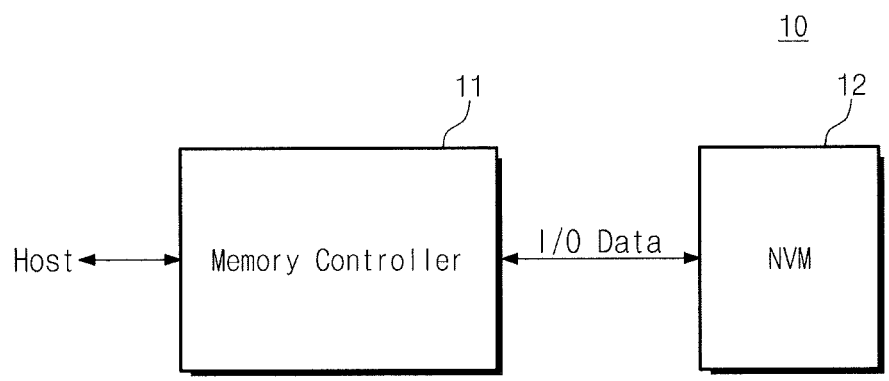
FIG. 1 is a schematic view of an embodiment of a memory system.

Reference will now be made in detail to the embodiments of the present general inventive concepts, examples of which are illustrated in the accompanying drawings, wherein like reference numerals refer to the like elements throughout. The embodiments are described below in order to explain the present general inventive concepts by referring to the figures.

FIG. 1 is a schematic view of an embodiment of a memory system. Referring to FIG. 1, the memory system 10 may include a memory controller 11 and a nonvolatile memory device (NVM) 12. The memory controller 11 may control the nonvolatile memory device 12 in response to control commands from a host. The memory controller 11 may provide the nonvolatile memory device 12 with commands, addresses, or data to be stored. The nonvolatile memory device 12 may provide the memory controller 11 with data stored in the NVM in response to a request from the memory controller 11.

Figure 2:
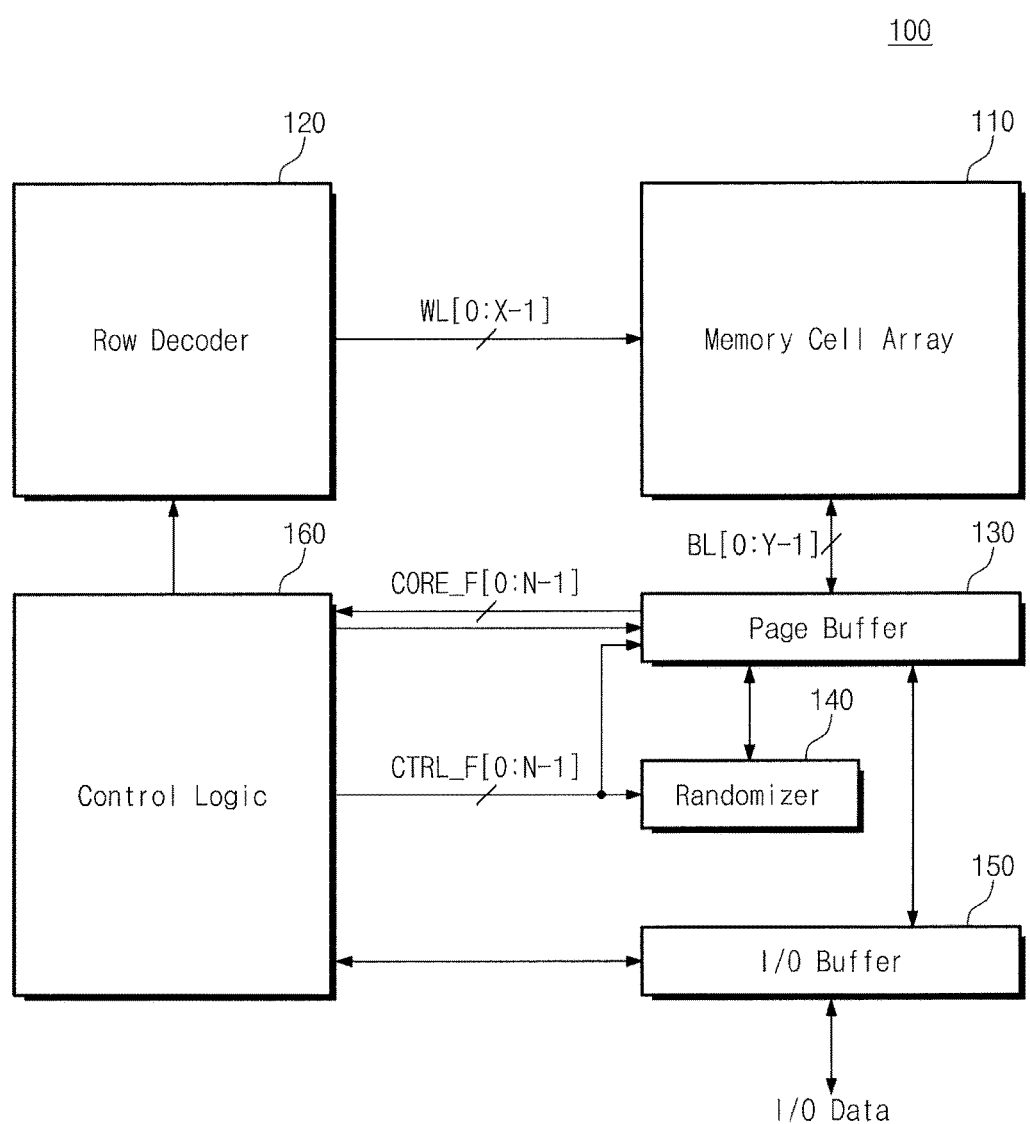
FIG. 2 is a schematic view of a nonvolatile memory device according to an embodiment of the inventive concept.

FIG. 2 is a schematic view of a nonvolatile memory device according to an embodiment of the inventive concept. Referring to FIG. 2, in various embodiments the nonvolatile memory device 100 may include a memory cell array 110, a row decoder 120, a page buffer 130, a randomizer 140, an input/output buffer 150, and control logic 160.

The memory cell array 110 is connected to the row decoder 120 via word lines WL[0;X−1]. The memory cell array 110 may be connected to the page buffer 130 via bit lines BL[0;Y−1]. The memory cell array 110 may include NAND cell strings. Alternatively, the memory cell array 110 may include NOR cells. The NAND cell strings may be formed in a direction perpendicular to or in parallel with a substrate. The memory cell array 110 may include memory cells configured as NAND cell strings. Memory cells may be programmed, erased, or read by using bit line and word line voltages. In some embodiments, each of the memory cells in the memory cell array 110 may include a multi-level cell (MLC) storing at least two bits.

The memory cell array 110 may include pages (not shown). The term "page" as used herein refers to a group of memory cells connected to a common word line. A page may be further divided into N segments. Each segment may include memory cells. According to an embodiment of the inventive concept, the operation of a randomizer or an error correction code circuit is performed in groups (e.g., units) of segments.

For example, when "N" is set to "4", a program operation may be performed with respect to all memory cells in four segments of a page. In another embodiment, a program operation may be performed with respect to memory cells of only some of the four segments in the page.

A row address RA received from a memory controller by the nonvolatile memory device 100 selects at least one of the word lines WL[0:X−1] of the memory cell array 110. A column address CA received from the memory controller by the nonvolatile memory device 100 selects at least one segment of a selected page. A page may include additional memory cells for storing information indicating whether memory cells of a segment are programmed. The additional memory cells may form segments different from the above-described segments. The page and segments of the memory cell array 110 will be described with reference to FIG. 3.

The row decoder 120 may select one of the pages of the memory cell array 110 in response to a command from the control logic 160. The row decoder 120 may select one of the word lines WL[0:X−1] in response to a command from the control logic 160. The term "selected page" as used herein refers to selecting memory cells connected to a selected word line.

The row decoder 120 may apply various voltages to the word lines WL[0:X−1]. During a program operation, the row decoder 120 may supply a program/verification voltage Vpgm/Vfy to a selected word line, and a pass voltage Vpass to each of the unselected word lines. During a read operation, the row decoder 120 may supply a selection read voltage Vrd to a selected word line and a non-selection read voltage Vread to each of the unselected word lines.

The page buffer 130 may operate as a write driver or a sense amplifier. During the program operation, the page buffer 130 may be provided with write data from the input/output buffer 150. During the program operation, the page buffer 130 may supply a bit line voltage corresponding to data to be programmed to a selected bit line of the memory cell array 110. During the read operation, the page buffer 130 may sense data programmed in the memory cells of a selected segment via the bit lines BL[0:Y−1]. During the read operation, the page buffer 130 may output sensed data to the input/output buffer 150.

As described above, a page may be divided into a plurality of segments. During the program operation, the page buffer 130, according to an embodiment of the inventive concept, may be provided with information pertaining to whether memory cells of any segment are to be programmed, from the control logic 160. The page buffer 130 may program the information in the additional memory cells of the memory cell array 110.

During the read operation, the page buffer 130, according to an embodiment of the inventive concept, may be provided with information pertaining to whether memory cells of any segment are programmed, from the additional memory cells of the memory cell array 110. The page buffer 130 may provide the information to the control logic 160.

During the program operation, the randomizer 140 may randomize data to be programmed in memory cells of a selected segment. During the read operation, the randomizer 140 may perform a de-randomization operation with respect to data that is sensed from memory cells of a selected segment and is stored in the page buffer 130. The term "de-randomization" (or de-randomize) as used herein means to undo the randomization of the data (e.g. by applying an inverse function). According to an embodiment of the inventive concept, the randomizer 140 may be integrated together with the nonvolatile memory device 100 on the same chip. In another embodiment, the randomizer 140 may be included in the control logic 160.

During the program operation, the randomizer 140 may reduce the number of occurrences of a single bit value (e.g., either a "0" or a "1") in the data value to be written. Accordingly, a shift of a threshold voltage distribution of memory cells may be suppressed through the randomization operation of the randomizer 140.

The randomizer 140 may perform a randomization operation during the program operation. For example, the randomizer 140 may generate a seed from addresses from the memory controller. The randomizer 140 may generate a random sequence (RS) using the seed.

The randomizer 140 randomizes data stored in the page buffer 130 by using the generated random sequence RS. The page buffer 130 may program the randomized data in memory cells of a selected segment.

The randomizer 140 may perform a de-randomization operation during the read operation. The randomizer 140 may perform the de-randomization operation with respect to the read data stored in the page buffer 130 by using the random sequence RS that was used in the randomization operation. The de-randomized data may be output to the memory controller via the input/output buffer 150.

During the program operation, the input/output buffer 150 may provide the page buffer 130 with data received from the memory controller. During the read operation, the input/output buffer 150 may output data stored in the page buffer 130 to the memory controller. The input/output buffer 150 may provide the control logic 160 with commands or addresses received from the memory controller 11.

The control logic 160 may control one or more of the row decoder 120, the page buffer 130, the randomizer 140, or the input/output buffer 150 in response to a command from the memory controller. During the program operation, the control logic 160 may provide the row decoder 120 with the addresses received from the memory controller to select a page. The control logic 160 may control the input/output buffer 150 to send write data to the page buffer 130. The control logic 160 may control the page buffer 130 to send the write data to memory cells of a selected segment.

During the program operation, the control logic 160 may generate signals CTRL_F[0:N−1] for determining whether to operate the randomizer 140 and for which particular segments, based on the addresses received from the memory controller. The signals CTRL_F[0:N−1] may determine whether to operate the randomizer 140. The term "N" as used herein refers to the number of partitioned segments of a page.

For example, when "N" is "4", the control logic 160 may generate the signals CTRL_F[0:3] based on the addresses received from the memory controller. A page may be partitioned into four segments. If a program operation is performed with respect to only memory cells of a first segment, the control logic 160 may activate a signal CTRL_F[0] and may deactivate the remaining signals CTRL_F[1:3]. The generation of the signals CTRL_F[0:3] by the control logic 160 during the program operation will be described later.

During the program operation, the control logic 160 may output the signals CTRL_F[0:N−1] to the page buffer 130 or the randomizer 140. The control logic 160 may program information pertaining to whether memory cells of any segment are programmed, in the additional memory cells in a page by sending the signals CTRL_F[0:N−1] to the page buffer 130.

During the program operation, the control logic 160 may control the randomizer 140 such that a randomization operation is performed on the write data stored in the page buffer 130. After the randomization operation is performed, the control logic 160 may control the page buffer 130 to send the randomized data to the memory cells of a selected segment.

During the read operation, the control logic 160 may provide the row decoder 120 with the addresses received from the memory controller 11 to select a page. The control logic 160 may control the page buffer 130 to send read data, stored in memory cells of a selected segment, to the page buffer 130. The control logic 160 may control the page buffer 130 to send the read data to the input/output buffer 150. The control logic 160 may control the input/output buffer 150 to output the read data to the memory controller.

In contrast to the program operation, during the read operation, the control logic 160 may generate the signals CTRL_F[0:N−1] for determining whether to operate the randomizer 140, further based on the signals CORE_F[0:N−1], instead of the addresses received from the memory controller 11. The term "N" as used herein refers to the number of partitioned segments of a page.

For example, when "N" is "4", in contrast to the program operation, the control logic 160 may generate the signals CTRL_F[0:3] based on the signals CORE_F[0:3]. A page may be partitioned into four segments. The signals CORE_F[0:3] may indicate whether memory cells of any one or more of four segments are programmed. The process of generating the signals CORE_F[0:3] will be described later. If a program operation is performed with respect to only the memory cells of a first segment, the control logic 160 may activate the signal CTRL_F[0] and may deactivate the remaining signals CTRL_F[1:3].

During the read operation, the control logic 160 may control the randomizer 140 to perform a de-randomization operation on the read data stored in the page buffer 130. After the de-randomization operation is performed, the control logic 160 may control the page buffer 130 or the input/output buffer 150 to output the read data to the memory controller 11.

According to an embodiment of the inventive concept, during the programming or reading of the NVM, an operation of the randomizer 140 may be performed or skipped according to each segment of a page, under control of the control logic 160. According to the nonvolatile memory device 100, a program time and a read time may be reduced in proportion to how often the randomizer 140 operation is skipped, thereby reducing power consumption.

Figure 3:
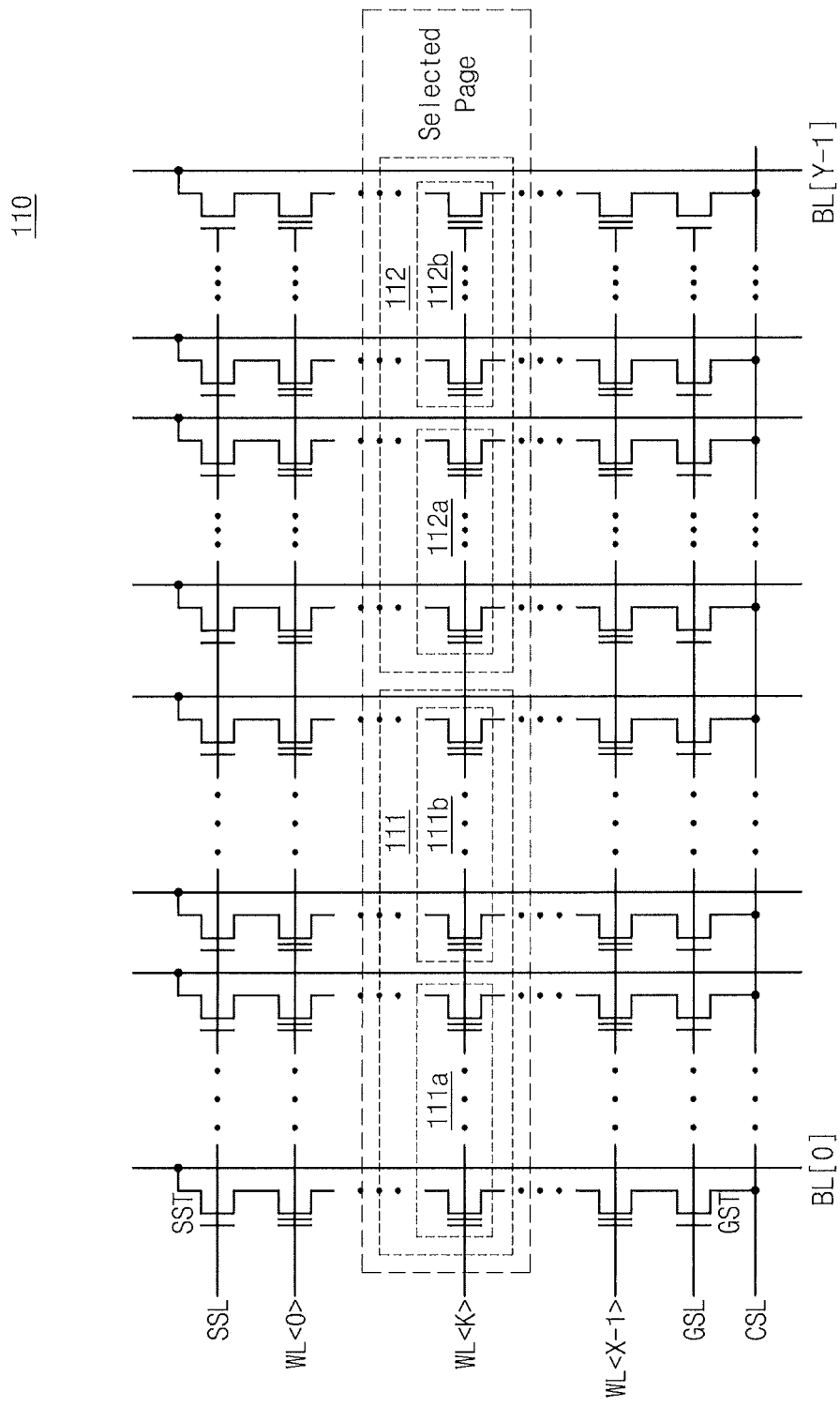

FIG. 3 and FIG. 4 are schematic views of embodiments of a memory cell array. Referring to FIG. 3 and FIG. 4, the memory cell array 110 may include NAND cell strings. The NAND cell strings of the memory cell array 110 are connected to bit lines BL[0:Y−1] via string selection transistors (SST), respectively. The NAND cell strings are connected to a common source line CSL via ground selection transistors GST, respectively.

During a program operation, a program/verification voltage Vpgm/Vfy is applied to a selected word line (e.g., WL[k]). A pass voltage Vpass is applied to each of the unselected word lines. During a read operation, a selection read voltage Vrd is applied to the selected word line (e.g., WL[k]), and a non-selection read voltage Vread is applied to each of the unselected word lines.

Referring to FIG. 3, a page, which is selected by the selected word line WL[k], may include a first area 111 or a second area 112. According to an embodiment, the first area 111 or the second area 112 may be logically designated. In one example, the first area 111 or the second area 112, or both, are logically designated by defining a range of column addresses for each area, where the memory cells for each area are physically adjacent to each other. In another embodiment, the memory cells of each area (e.g. 111 or 112) are interleaved or not physically adjacent.

The first area 111 may include segments 111a and 111b. Each of the segments 111a and 111b may include memory cells. In some embodiments, the memory cell may be a multi-level cell storing at least two bits. Referring to FIG. 3, when "N" is "2", the first area 111 may include the segments 111a and 111b. Referring to FIG. 4, when "N" is "4", the first area 111 may include the segments 111a, 111b, 111c, and 111d. Returning to FIG. 3, during a program operation, write data may be programmed in the memory cells of the segment 111a. Subsequently, different write data may be programmed, or may not be programmed, in the memory cells of the segment 111b.

The second area 112 may include segments 112a and 112b. Each of the segments 112a and 112b may include memory cells. The number of segments in the second area 112 is the same as the number of segments in the first area 111, (e.g., the number of segments in the second area 112 is "N"). Referring to FIG. 3, when "N" is "2", the second area 112 may include the segments 112a and 112b. Referring to FIG. 4, when "N" is "4", the second area 112 may include the segments 112a, 112b, 112c, and 112d.

Returning to FIG. 3, information pertaining to whether memory cells of the segment 111a in the first area 111 are programmed may be programmed in memory cells of the segment 112a in the second area 112. Similarly, information pertaining to whether memory cells of the segment 111b in the first area 111 are programmed may be programmed in memory cells of the segment 112b in the second area 112. For example, the segments 112a and 112b of the second area 112 may respectively correspond to the segments 111a and 111b of the first area 111. The number of memory cells included in each segment of the second area 112 may be less than the number of memory cells included in each segment of the first area 111.

During a read operation, read data stored in the memory cells included in the segments 112a and 112b of the second area 112 may be also provided to the page buffer 130. The page buffer 130 may generate the signals CORE_F[0:N−1] in response to the read data provided thereto and may send the signals CORE_F[0:N−1] to the control logic 160. The signals CORE_F[0:3] may indicate whether memory cells of any one of the segments 111a and 111b in the first area 111 are programmed. For example, when "N" is "2", during the read operation, the page buffer 130 may generate the signals CORE_F[0:1]. Similarly, when "N" is "4", during the read operation, the page buffer 130 may generate the signals CORE_F[0:3].

Referring to FIG. 3 and FIG. 4, the second area 112 may be designated adjacent to the first area 111. Although not illustrated in FIG. 3 and FIG. 4, the second area 112 may be included in the first area 111. Referring to FIG. 3, a selected page includes the segment 111a, the segment 111b, the segment 112a, and the segment 112b that are sequentially arranged on the same row. In another embodiment (not illustrated in FIG. 3), the selected page includes the segment 111a, the segment 112a, the segment 111b, and the segment 112b that are sequentially arranged on the same row.

The embodiment shown in FIG. 3 has a value of "N" equal to "2". The embodiment shown in FIG. 4 has a value of "N" equal to "4". However, embodiments of the inventive concept may not be limited thereto. For example, when "N" is equal to "M", each of the first and second areas 111 and 112 may include M segments.

Figure 5:
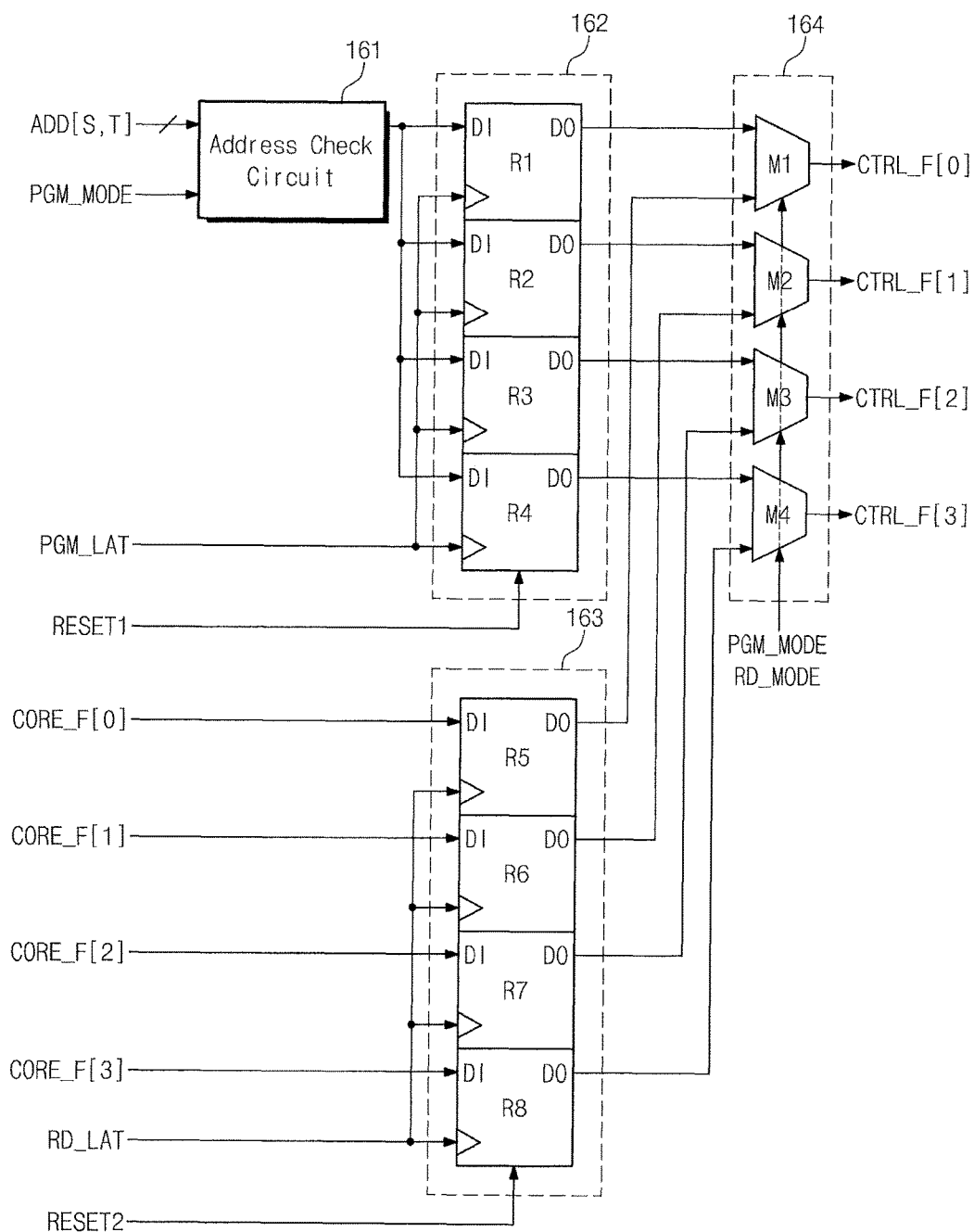
FIG. 5 is a schematic view of an embodiment of control logic illustrated in FIG. 2.

FIG. 5 is a schematic view of an embodiment of the control logic 160 shown in FIG. 2. Referring to FIG. 5, the control logic 160 may include an address check circuit 161, a first register 162, a second register 163, and a selection circuit 164. As shown in FIG. 5 the control logic 160 is configured with "N" equal to "4".

Referring to FIG. 4 and FIG. 5, the address check circuit 161 may receive addresses ADD[S, T] for selecting the segments 111a, 111b, 111c, and 111d of the first area 111 in a selected page during a program operation. During the program operation, the address check circuit 161 may determine whether memory cells of any segment in the first area 111 of the selected page are to be programmed, based on the addresses ADD[S, T]. The address check circuit 161 may send the determination result to the first register 162.

The address check circuit 161 may receive a program mode signal PGM_MODE during the program operation. The program mode signal PGM_MODE may indicate that the nonvolatile memory device 100 is performing the program operation. The program mode signal PGM_MODE may be generated by the control logic 160 during the program operation. In various embodiments, the address check circuit 161 operates only during the program operation and is otherwise deactivated during the remaining operations. Accordingly, unnecessary power consumption due to a change of the addresses ADD[S, T] may be reduced.

The address check circuit 161 may operate according to the addresses ADD[S, T] as follows. When the addresses ADD[S, T] all are "0", the address check circuit 161 may determine that memory cells of the segment 111a are to be programmed. When the addresses ADD[S, T] all are "1", the address check circuit 161 may determine that memory cells of the segment 111d are to be programmed. If the number of segments increases, the number of addresses, which the address check circuit receives, may increase. Similarly, if the number of segments decreases, the number of addresses, which the address check circuit 161 receives, may decrease.

The first register 162 may include the same number of registers as the number N of segments. The first register 162 may store determination results of the address check circuit 161 during the program operation. Referring to FIG. 5, when "N" is "4", the first register 162 may include four registers R1, R2, R3, and R4. The first register 162 may store the results of the address check circuit 161 in response to a program latch signal PGM_LAT. During the program operation, the program latch signal PGM_LAT may be generated by the control logic 160 when the results of the address check circuit 161 are output. A first reset signal RESET1 may be generated by the control logic 160 after the program operation ends.

The second register 163 may include the same number of registers as the number N of segments. During a read operation, the second register 163 may be provided with signals CORE_F[0:N−1] received from the page buffer 130. As described above, the signals CORE_F[0:N−1] indicates information pertaining to whether memory cells of any one of N segments are programmed.

Referring to FIG. 5, when "N" is "4", the second register 163 may include four registers R5, R6, R7, and R8. In response to a read latch signal RD_LAT, the second register 163 may store information pertaining to whether memory cells of any one among four segments 111a to 111d are programmed, through the signals CORE_F[0:3]. During the read operation, the read latch signal RD_LAT may be generated by the control logic 160 when the signals CORE_F[0:3] are output. A second reset signal RESET2 may be generated by the control logic 160 after the read operation ends.

The selection circuit 164 may include the same number of multiplexers as the number of segments. The multiplexers may receive output results of the first register 162 or the second register 163 to output the signals CTRL_F [0:N−1] for determining whether to operate the randomizer 140. Referring to FIG. 5, when "N" is "4", the selection circuit 164 may include four multiplexers M1, M2, M3, and M4. The selection circuit 164 may output the signals CTRL_F [0:3].

The selection circuit 164 may receive the program mode signal PGM_MODE or the read mode signal RD_MODE. If the program mode signal PGM_MODE is activated, the selection circuit 164 may select and output the contents of the first register 162. If the read mode signal RD_MODE is activated, the selection circuit 164 may select and output the contents of the second register 163. The read mode signal RD_MODE being activated indicates that the nonvolatile memory device 100 is performing the read operation. The control logic 160 may generate the read mode signal RD_MODE in response to a read command.

When "N" is "4", the control logic 160 may generate the signals CTRL_F[0:3] for determining whether to operate the randomizer 140 for each operation, (e.g., for each program operation and for each read operation). In this embodiment, compared to the embodiment shown in FIG. 5, the number of signals for determining whether to operate the randomizer 140 may be doubled. For example, eight signals CTRL_F_PGM[0:3] and CTRL_F_RD[0:3] (not illustrated in FIG. 5) may be generated. If the selection circuit 164 is used in the control logic 160, as illustrated in FIG. 5, only four signals CTRL_F[0:3] are needed to determine whether to operate the randomizer 140. Specifically, the selection circuit 164 may prevent signals CTRL_F[0:N−1] from increasing unnecessarily, by multiplexing the CTRL signals required for programming with the corresponding signals required for read.

Figure 6:
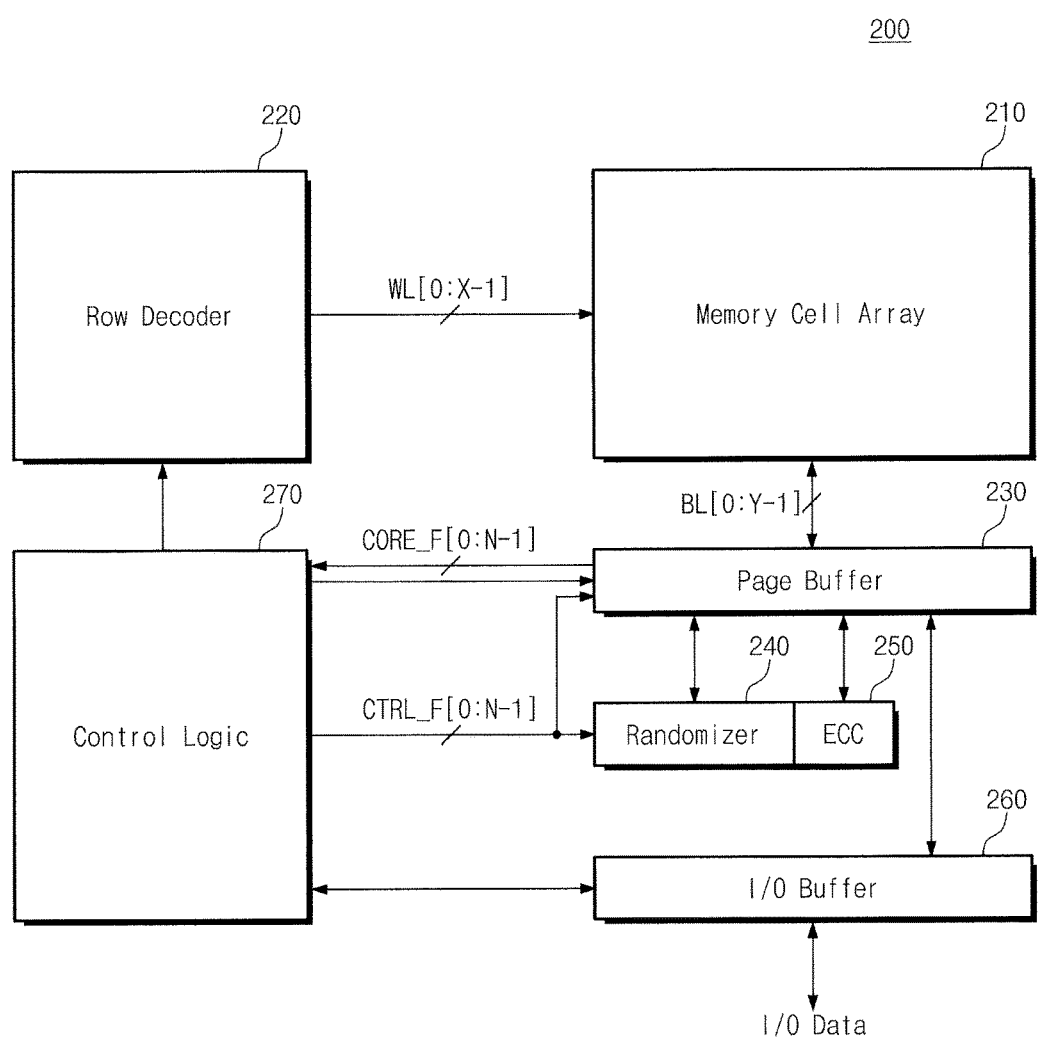
FIG. 6 is a schematic view of a nonvolatile memory device according to an embodiment of the inventive concept.

FIG. 6 is a schematic view of a nonvolatile memory device according to an embodiment of the inventive concept. Referring to FIG. 6, the nonvolatile memory device 200 may include a memory cell array 210, a row decoder 220, a page buffer 230, a randomizer 240, an error correction circuit 250, an input/output buffer 260, and control logic 270. In some embodiments, the randomizer 240, the error correction circuit 250, or both, may be included in the control logic 270. The memory cell array 210, the row decoder 220, the page buffer 230, the randomizer 240, and the input/output buffer 260 of the nonvolatile memory device 200 perform the same functions as the respective memory cell array 110, the row decoder, 120, the page buffer 130, the randomizer 140, and the input/output buffer 150 of the nonvolatile memory device 100, and a description thereof is thus omitted.

During a program operation, the error correction circuit 250 may generate parity bits of an error correction code (ECC) by using data stored in the page buffer 230. The parity bits may be stored in a selected page together with randomized data. For example, referring to FIG. 3 or FIG. 4, parity bits may be stored in memory cells of the second area 112.

During the read operation, the error correction circuit 250 may detect and correct an error of data read from a selected segment by using the stored parity bits in the selected page. After the error correction operation of the error correction circuit 250 ends, the randomizer 240 may perform a de-randomization operation with respect to the stored data in the page buffer 230.

According to an embodiment of the inventive concept, the error correction circuit 250 may be integrated with the nonvolatile memory device 200 on the same chip.

The control logic 270 may perform the same function as the control logic 160 described with reference to FIG. 5. The control logic 270 may include the same elements as the control logic 160 of FIG. 5 such as the address check circuit 161, the first register 162, the second register 163, or the selection circuit 164. The control logic 270 may also control the error correction circuit 250, in contrast to the control logic 160 of FIG. 2.

During the program operation, the control logic 270 may generate the signals CTRL_F[0:N−1] for determining whether to operate the randomizer 240 and the error correction circuit 250, based on addresses received from the memory controller. For example, when "N" is "4", the control logic 160 may generate the signals CTRL_F[0:3] based on the addresses received from the memory controller. During the program operation, the control logic 270 may output the signals CTRL_F[0:N−1] to the page buffer 230, the randomizer 240, the error correction circuit 250, or any combination thereof.

During the program operation, the control logic 270 may control the randomizer 240 to perform a randomization operation on the data stored in the page buffer 230. Subsequently, the control logic 270 may control the error correction circuit 250 to perform an error correction operation on the randomized data. In another embodiment, the order of the randomization operation and the error correction operation may be interchangeable with each other. Data, which is randomized and has an ECC code generated with the error correction operation, may be programmed in memory cells of a selected segment via the page buffer 230.

In contrast to the program operation, during the read operation, the control logic 270 may generate the signals CTRL_F[0:N−1] for determining whether to operate the randomizer 240 and the error correction circuit 250, based on signals CORE_F[0:N−1].

During the read operation, the control logic 270 may control the error correction code circuit 250 to perform an error correction operation on the read data stored in the page buffer 230. After the error correction operation is performed, the control logic 270 may control the randomizer 240 to perform a de-randomization operation on the error-corrected data. After the error correction operation and the de-randomization operation are performed, the control logic 270 may control the page buffer 230 or the input/output buffer 260 to output the read data to the memory controller.

In another embodiment, the order of the error correction operation and the de-randomization operation may depend on the operating order of the randomizer 240 and the error correction circuit 250 during the program operation. Specifically, when during the program operation, the control logic 270 operates the randomizer 240 and then operates the error correction circuit 250, the control logic 270 may operate the error correction circuit 250 first and then operate the randomizer 240, during the read operation. In contrast, when, during the program operation, the control logic 270 operates the error correction circuit 250 and then operates the randomizer 240, the control logic 270 may operate the randomizer 240 first and then operate the error correction circuit 250, during the read operation.

In the nonvolatile memory device 200 according to an embodiment of the inventive concept, during either the program operation or the read operation, operations of the randomizer 240 and the error correction circuit 250 may be performed or skipped according to each segment of a page, under control of the control logic 270. According to the nonvolatile memory device 200, a program time and a read time may be reduced when the operations of either the randomizer 240, the error correction circuit 250, or both, are skipped, thereby reducing power consumption.

Figure 7:
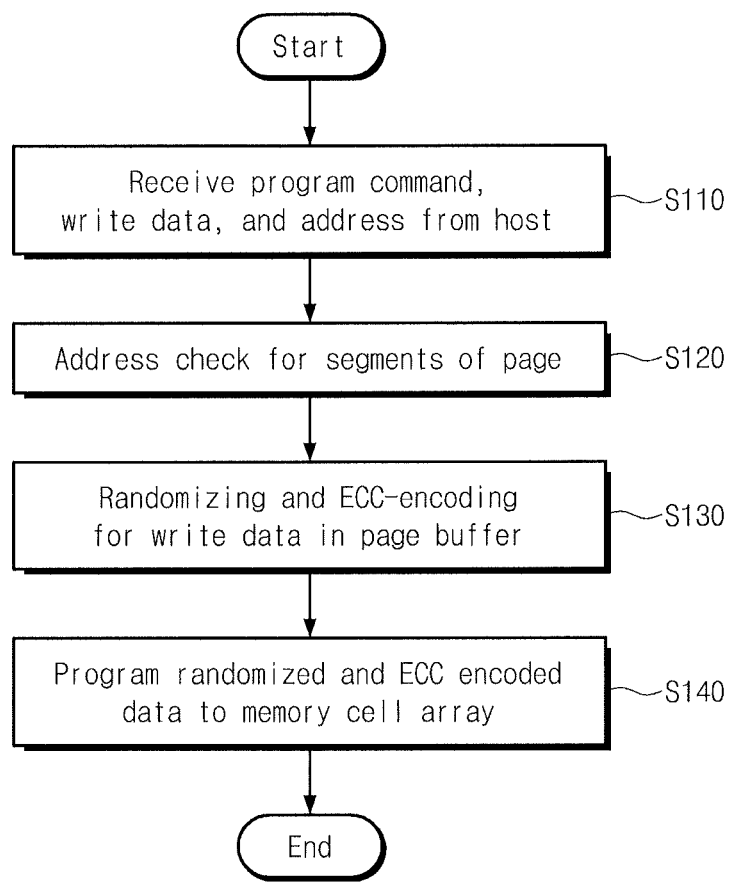
FIG. 7 is a flowchart view of a method of programming a nonvolatile memory device according to an embodiment of the inventive concept.

FIG. 7 is a flowchart view of a method of programming a nonvolatile memory device, according to an embodiment of the inventive concept. An example of programming the nonvolatile memory device 200 of FIG. 6 is illustrated in FIG. 7.

At operation S110, the nonvolatile memory device 200 may receive a program command, write data, and addresses from the memory controller. The control logic 270 may provide the write data to the page buffer 230 in response to the program command. Subsequently, the write data in the page buffer 230 is randomized and an ECC code generated prior to sending the data from the page buffer 230 to the memory cell array 210.

At operation S120, the address check circuit 161 of the control logic may be provided with addresses for determining whether memory cells of any segment in the first area of the selected page are memory cells to be programmed. The first register 162 of the control logic may store the results of the address check circuit 161 (e.g., to identify which segment should be programmed). During the program operation, the control logic 270 may generate the signals CTRL_F[0:N−1] for determining whether to operate the randomizer 240 and the error correction circuit 250, based on results stored in the first register 162. The signals CTRL_F[0:N−1] may be sent by the control logic 270 to the randomizer 240 and the error correction circuit 250.

At operation S130, the write data stored in the page buffer may be selectively randomized, and the error correction operation may be performed on the write data that is selectively randomized. A detailed description of operation S130 will be described with reference to FIG. 8.

At operation S140, a randomization operation may be performed, and the error-corrected data may be programmed in the memory cell array 210. Subsequently, a program operation of the nonvolatile memory device 200 ends.

Figure 8:
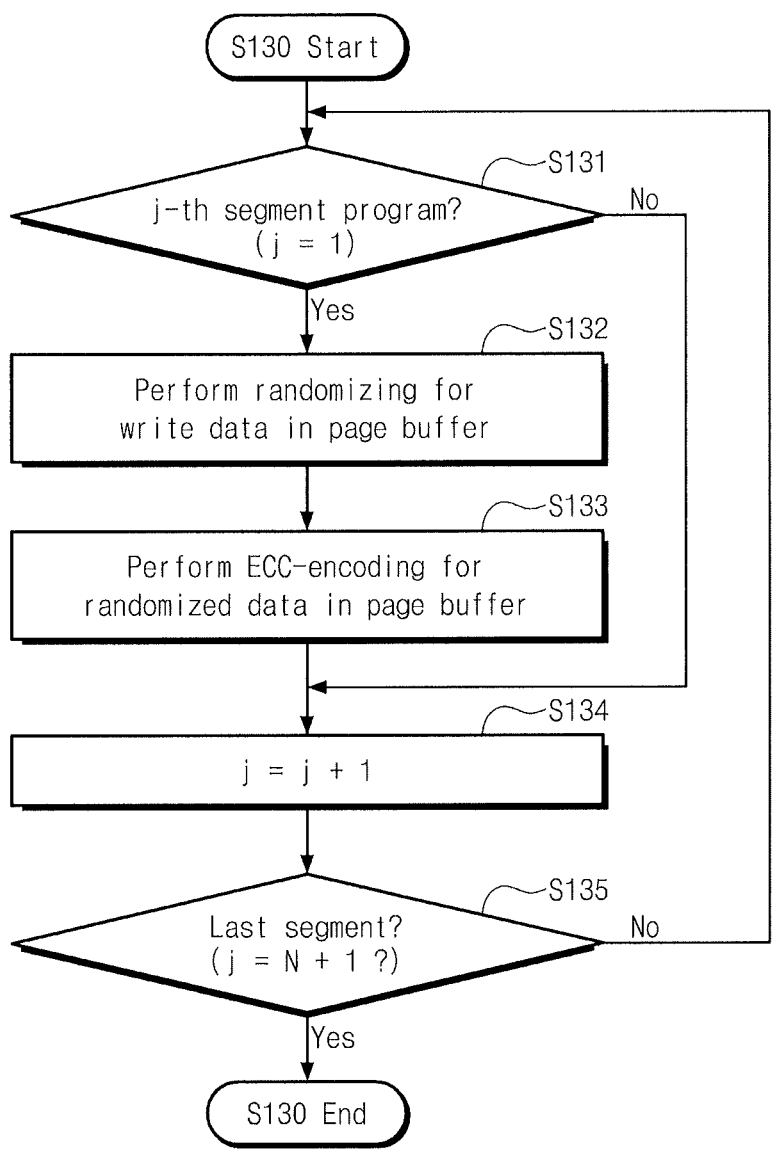
FIG. 8 is a flowchart view of a portion of a program operation of a nonvolatile memory device according to an embodiment of the inventive concept.

FIG. 8 is a flowchart view of a portion of a program operation of the nonvolatile memory device, according to an embodiment of the inventive concept. Further detail of the operation S130 of FIG. 7 is illustrated in FIG. 8.

At operation S131, it may be determined whether a j-th segment is programmed. "j" may be "1" when entering operation S131 for the first time during a program operation. To this end, the control logic 270 may determine whether a signal CTRL_F[0] is activated. When the j-th segment is programmed (e.g., the decision branch of S131 is "Yes"), at operation S132, write data to be programmed in memory cells of a first segment may be randomized by the randomizer 240. Subsequently, at operation S133, the error correction circuit 250 may perform an error correction operation on the randomized data. Subsequently, operation S134 is performed. When the j-th segment is not programmed (e.g., the decision branch of S131 is "No"), operations S132 and S133 are skipped, and operation S134 is performed. As described above, operation S132 and operation S133 may be interchangeable with each other.

At operation S134, a value of "j" may be incremented. In one embodiment, a counter circuit (not illustrated) may sequentially increase a value of "i" of the signal CTRL_F[i]. The control logic 270 may include the counter circuit to determine whether the signals CTRL_F[0:N−1] are activated.

At operation S135, if the last segment has not been determined, then operations S131 to S134 are performed. Because "j" starts from "1", if "j" reaches "N+1" at S135, then operations S131 to S134 have been performed for all segments. When operations S131 to S134 are performed with respect to the last segment, operation S130 ends. When operations S131 to S134 are not performed with respect to the last segment (e.g., the decision branch of S135 is "No"), operation S131 is performed with respect to a next segment.

An example of a program operation of the nonvolatile memory device 200 of FIG. 6 is illustrated in FIG. 7 and FIG. 8. When an error correction operation at S130 in the flowchart of FIG. 7 is skipped and operation S133 of the flowchart of FIG. 8 is skipped, the flowcharts of FIG. 7 and FIG. 8 correspond to a program operation of the nonvolatile memory device 100 illustrated in FIG. 2.

Figure 9:
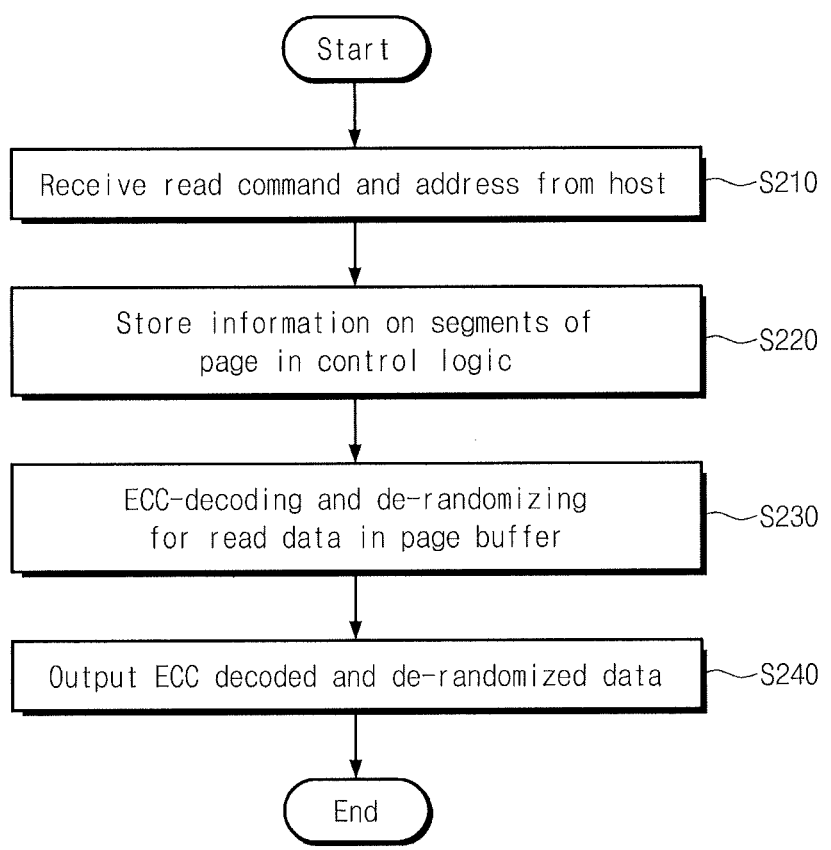
FIG. 9 is a flowchart view of a read operation of the nonvolatile memory device according to an embodiment of the inventive concept.

FIG. 9 is a flowchart view of a read operation of the nonvolatile memory device, according to an embodiment of the inventive concept. An example of a read operation of the nonvolatile memory device 200 of FIG. 6 is illustrated in FIG. 9.

At operation S210, the nonvolatile memory device 200 may receive a read command from the memory controller (or from the Host of FIG. 1 through the memory controller 11). The nonvolatile memory device 200 may receive address information through the input/output buffer 260. In response to the read command, the row decoder 220 may activate a selected word line WL[k] of the memory cell array 210. The page buffer 230 may read and store data from a selected segment. Before the stored data in the page buffer 230 is sent to the input/output buffer 260, a randomization operation and an error correction operation may be respectively performed by the randomizer 240 and the error correction circuit 250 with respect to the stored data.

At operation S220, the page buffer 230 may output the signals CORE_F[0:N−1] to the control logic 270 in response to a command from the control logic 270. As described above, the signals CORE_F[0:3] may indicate whether memory cells of any one of segments in the first area 111 are programmed. The signals CORE_F[0:N−1] may be stored in the second register 163 of the control logic 270.

At operation S230, read data stored in the page buffer 230 may be selectively error corrected, and the randomization operation may be performed with respect to the data that is selectively error corrected. A detailed description of operation S230 will be described with reference to FIG. 10.

At operation S240, the error correction operation may be performed, and the data, which is de-randomized, may be output to the memory controller. Subsequently, the read operation of the nonvolatile memory device 200 ends.

Figure 10:
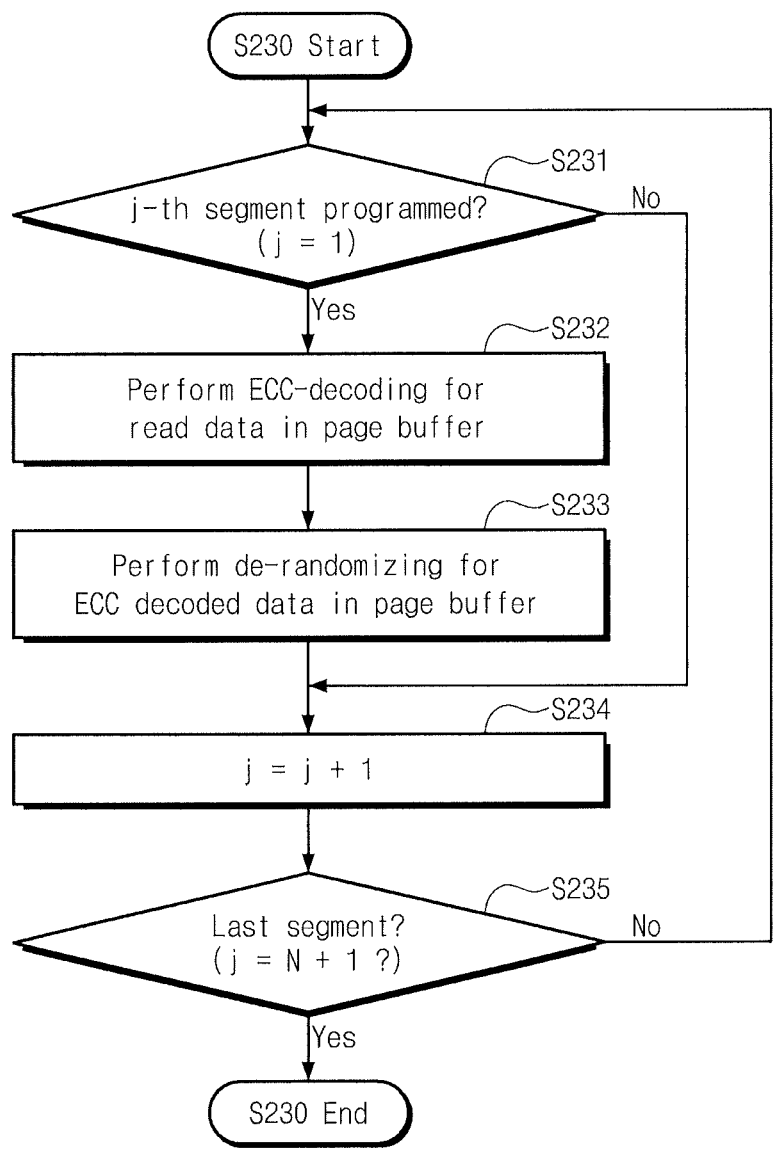
FIG. 10 is a flowchart view of a portion of a read operation of the nonvolatile memory device according to an embodiment of the inventive concept.

FIG. 10 is a flowchart view of a portion of a read operation of the nonvolatile memory device, according to an embodiment of the inventive concept. A detailed description of the operation S230 of FIG. 9 is illustrated in FIG. 10.

At operation S231, a determination is made as to whether a j-th segment is programmed. "j" may be "1" when entering operation S231 for the first time during a read operation. The control logic 270 may determine whether a signal CTRL_F[1] is activated. When the j-th segment is programmed (e.g., the decision branch of S231 is "Yes"), at operation S232, an error correction operation may be performed by the error correction circuit 250 on the read data stored in the page buffer 230. Subsequently, at operation S233, a de-randomization operation may be performed by the randomizer 240 on the data which is error corrected. Subsequently, operation S234 is performed. When the j-th segment is not programmed (e.g., the decision branch of S231 is "No"), operations S232 and S233 are skipped, and operation S234 is performed. Operation S234 is the same as operation S134 of FIG. 8, and a description thereof is thus omitted. As described above, operation S232 and operation S233 may be interchangeable with each other.

At operation S235, if the last segment has not been determined, then operations S231 to S234 are performed. Because "j" starts from "1", if "j" reaches "N+1" at S235, then operations S231 to S234 are performed with respect to all segments. When operations S231 to S234 are performed with respect to the last segment (e.g., the decision branch of S231 is "Yes"), operation S230 ends. When operations S231 to S234 are not performed with respect to the last segment (e.g., the decision branch of S231 is "No"), operation S231 is performed with respect to a next segment.

An example of a read operation of the nonvolatile memory device 200 of FIG. 9 is illustrated in FIG. 9 and FIG. 10. When an error correction operation at S230 in the flowchart of FIG. 9 is skipped and operation S232 of the flowchart of FIG. 10 is skipped, the flowcharts of FIG. 9 and FIG. 10 may illustrate a read operation of the nonvolatile memory device 100 illustrated in FIG. 2.

Figure 11:
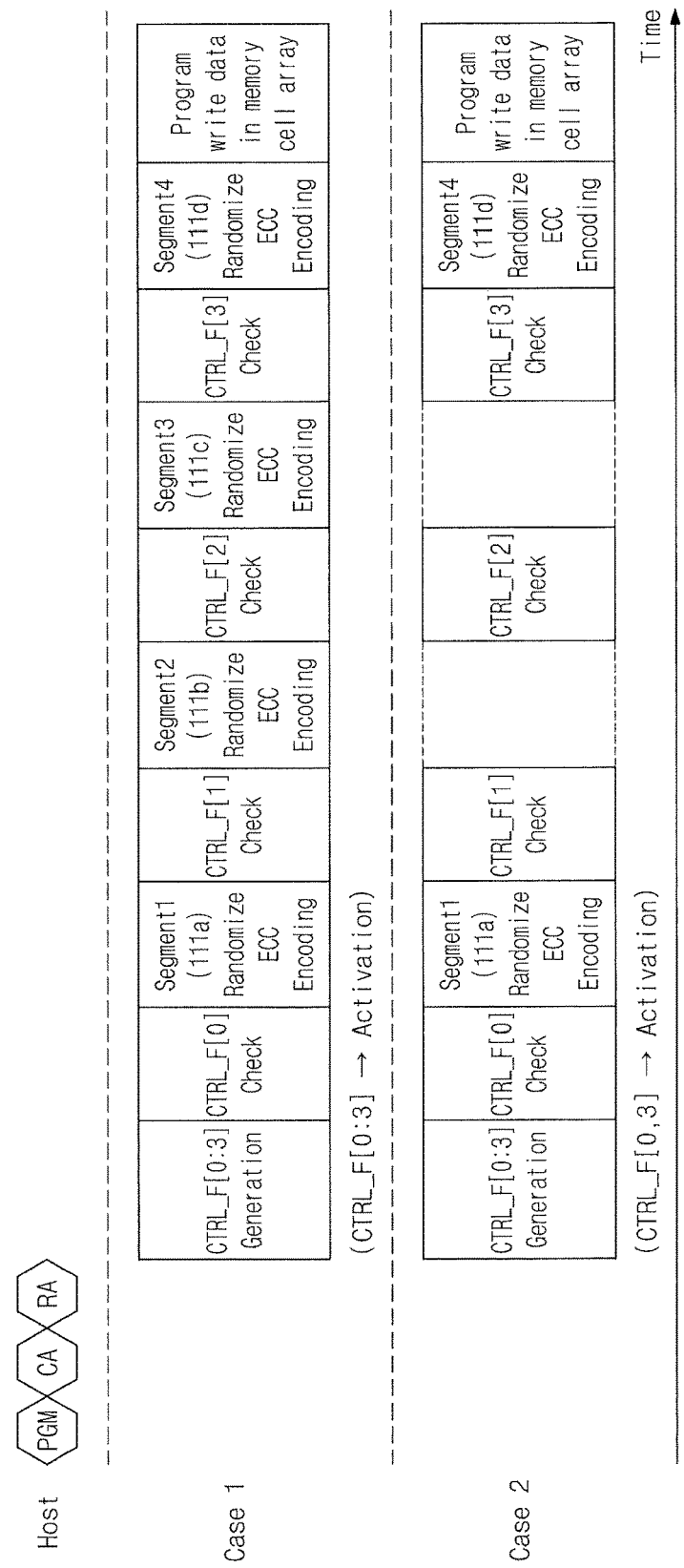
FIG. 11 is a timing diagram illustrating a program operation of the nonvolatile memory device according to an embodiment of the inventive concept.

FIG. 11 is a timing diagram illustrating a program operation of the nonvolatile memory device, according to an embodiment of the inventive concept. FIG. 11 will be described with reference to FIGS. 4 and 5. When "N" is "4", memory cells of all segments 111a to 111d of the first area 111 are programmed and memory cells of some of the segments 111a to 111d of the first area 111 are programmed as shown in FIG. 11. The term "PGM" (program mode) as used herein may mean a program command that a host generates. "CA" (column address) may mean addresses indicating a selected page. "RA" (row address) may mean addresses for selecting a page. In FIG. 11, the abscissa represents a time axis.

Case 1 of FIG. 11 shows a use case where the memory cells of all segments 111a to 111d in the first area 111 are programmed. In this case, the control logic 270 may activate all signals CTRL_F[0:3] based on CA (ADD[S, T] of FIG. 5). A randomization operation and an error correction operation may be sequentially performed with respect to write data to be programmed in the memory cells of all segments 111a to 111d.

Case 2 of FIG. 11 shows a use case where the memory cells of some of the segments 111a to 111d in the first area 111 are programmed. In this case, the control logic 270 may activate all signals CTRL_F[0:3] based on CA (ADD[S, T] of FIG. 5). The randomization operation and the error correction operation may be sequentially performed with respect to write data to be programmed in the memory cells of some segments 111a and 111d.

Referring to FIG. 11, according to an operating method of case 2, a program time is reduced by eliminating the randomization and ECC correction for 111b and 111c with a corresponding reduction of power consumption. Specifically, in case 2 of FIG. 11, two of ten time slots do not consume power.

Figure 12:
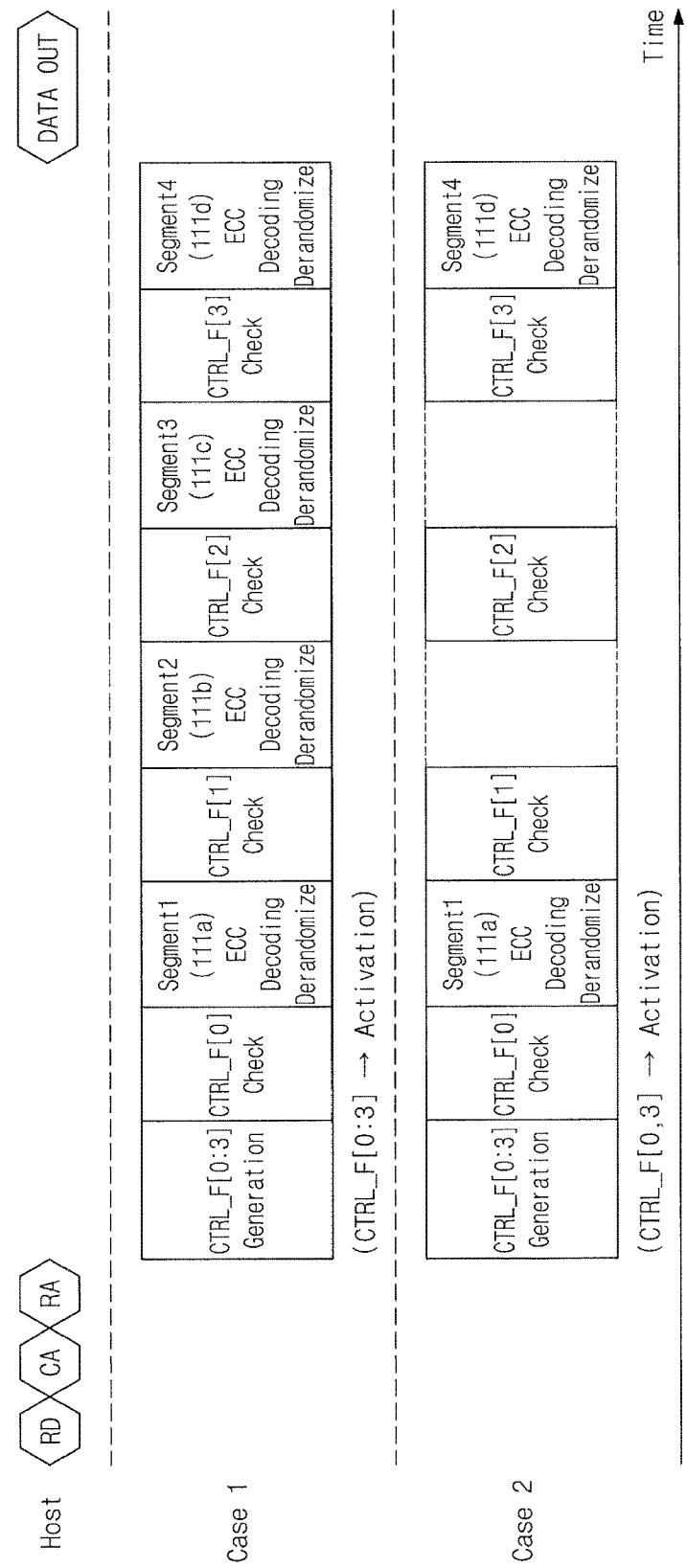
FIG. 12 is a timing diagram illustrating a read operation of the nonvolatile memory device according to an embodiment of the inventive concept.

FIG. 12 is a timing diagram illustrating a read operation of the nonvolatile memory device, according to an embodiment of the inventive concept. FIG. 12 will be described with reference to FIG. 4. When "N" is "4", case 1 shows memory cells of all segments 111a to 111d of the first area 111 being read, and case 2 shows memory cells of some of the segments 111a to 111d of the first area 111 being read. The term "RD" (read) as used herein may mean a read command that a host generates. The terms "CA" and "RA" are the same as described with reference to FIG. 11. In FIG. 11, the abscissa represents a time axis.

Case 1 of FIG. 12 shows a use case where the memory cells of all segments 111a to 111d in the first area 111 are read. In this case, the control logic 270 may activate all signals CTRL_F[0:3] based on signals CORE_F[0:3]. Data programmed in memory cells of all the segments 111a to 111d may be sent to the page buffer 230. An error correction operation and a de-randomization operation may be sequentially performed with respect to the data sent to the page buffer 230.

Case 2 of FIG. 12 shows a use case where the memory cells of some of the segments 111a to 111d in the first area 111 are read (e.g., 111a and 111d). In this case, the control logic 270 may activate the signals CTRL_F[0:3] based on the signals CORE_F[0:3]. Data programmed in memory cells of all the segments 111a and 111d may be sent to the page buffer 230. An error correction operation and a de-randomization operation may be sequentially performed with respect to the data sent to the page buffer 230.

Referring to FIG. 12, according to an operating method of case 2, a read time is reduced be eliminating the ECC correction and derandomization for 111b and 111c, with a corresponding reduction in power consumption.

Figure 13:
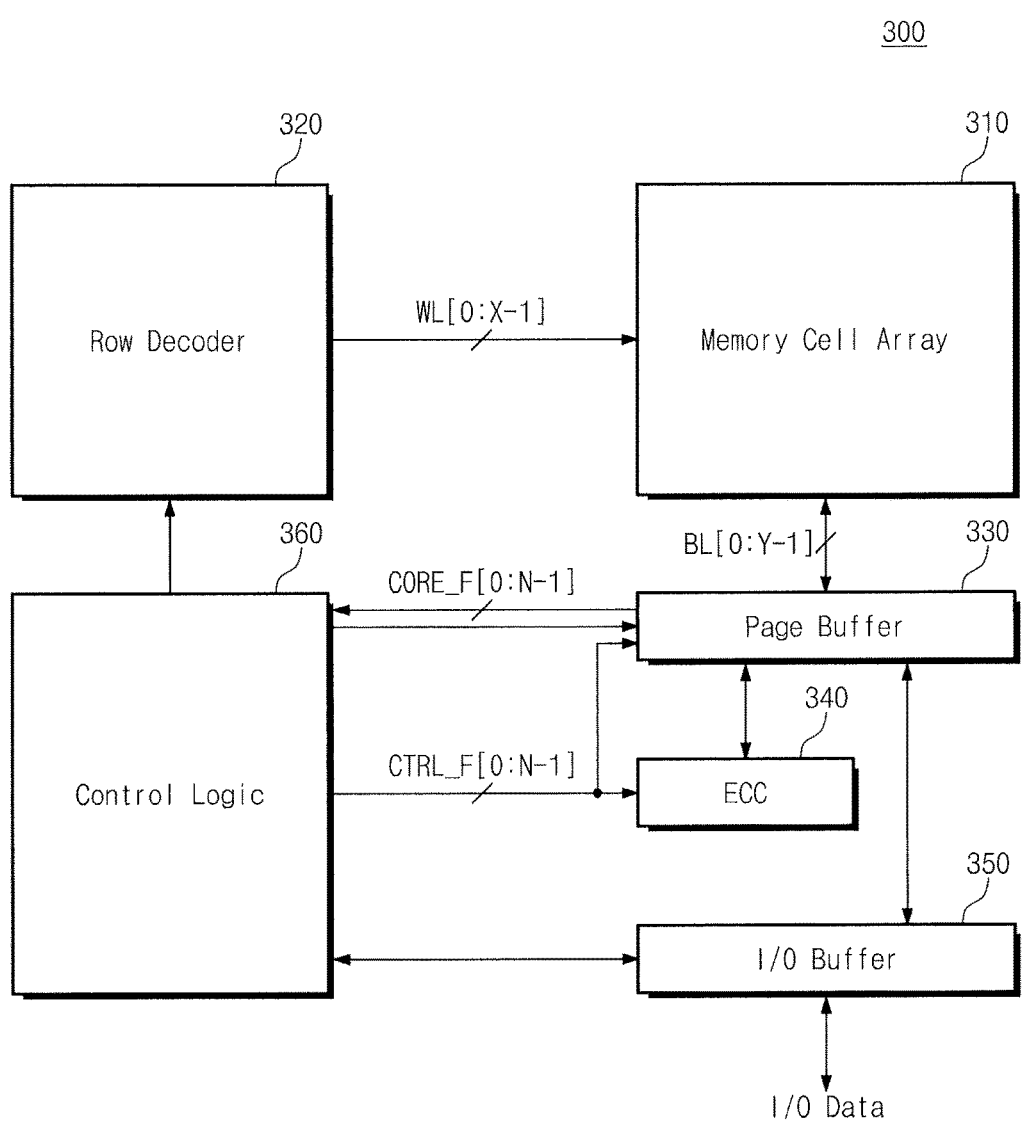
FIG. 13 is a schematic view of a nonvolatile memory device according to an embodiment of the inventive concept.

FIG. 13 is a schematic view of a nonvolatile memory device according to an embodiment of the inventive concept. Referring to FIG. 13, the nonvolatile memory device 300 may include a memory cell array 310, a row decoder 320, a page buffer 330, an error correction circuit 340 (e.g., ECC circuit), an input/output buffer 350, and control logic 360. In some embodiments, the error correction circuit 340 may be included in the control logic 360.

The memory cell array 310, the row decoder 320, the page buffer 330, the input/output buffer 350, and the control logic 360 of the nonvolatile memory device 300 perform the same functions as the respective memory cell array 110, the row decoder 120, the page buffer 130, the input/output buffer 150, and the control logic 160 of the nonvolatile memory device 100, and a description thereof is thus omitted. The error correction circuit 340 of the nonvolatile memory device 300 performs the same function as the error correction circuit 250 of the nonvolatile memory device 200, and a description thereof is thus omitted.

Referring to FIG. 13, the nonvolatile memory device 300 may not include the randomizer 240 compared to the nonvolatile memory device 200 illustrated in FIG. 6. As described with reference to the nonvolatile memory device 100, the nonvolatile memory device 300 may skip an error correction operation with respect to write data or read data of memory cells of each segment in a page during a program operation or a read operation. The nonvolatile memory device 300 may reduce a program time or read time due to the skipped operations, thereby reducing power consumption.

Figure 14:
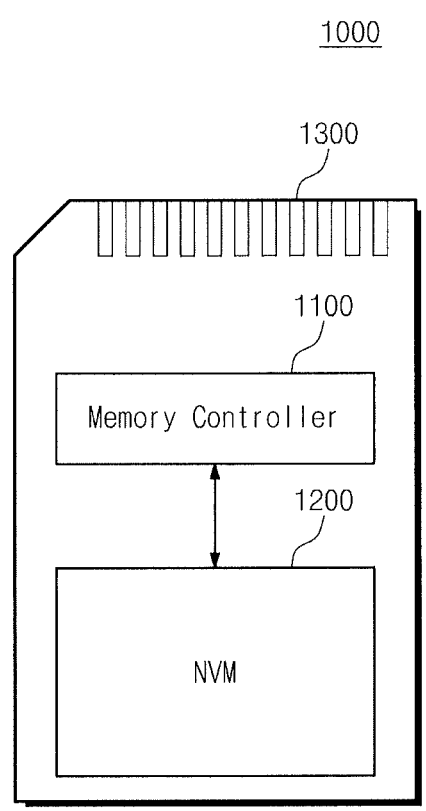
FIG. 14 is a schematic view of a memory card system including a nonvolatile memory device according to an embodiment of the inventive concept.

FIG. 14 is a schematic view of a memory card system including a nonvolatile memory device according to an embodiment of the inventive concept. Referring to FIG. 14, the memory card system 1000 includes a memory controller 1100, a nonvolatile memory device 1200, and a connector 1300.

The memory controller 1100 is connected to the nonvolatile memory device 1200. The memory controller 1100 is configured to access the nonvolatile memory device 1200. For example, the memory controller 1100 is configured to control an overall operation of the nonvolatile memory device 1200 including, (but not limited to), a read operation, a write operation, an erase operation, and a background operation. The background operation includes operations such as wear-leveling management and garbage collection.

The memory controller 1100 is configured to provide an interface between the nonvolatile memory device 1200 and a host. The memory controller 1100 is configured to drive firmware for controlling the nonvolatile memory device 1200. In an embodiment, the memory controller 1100 may include elements such as, (but not limited to), a random access memory (RAM), a processing unit, a host interface, a memory interface, and an error correction unit.

The memory controller 1100 may communicate with an external device via the connector 1300. The memory controller 1100 may communicate with an external device (e.g., a host) based on a specific communication protocol. For example, the memory controller 1100 may communicate with the external device through at least one of various communication protocols such as, (but not limited to), universal serial bus (USB), multimedia card (MMC), eMMC (embedded MMC), peripheral component interconnection (PCI), PCI-express (PCI-E), advanced technology attachment (ATA), a serial-ATA, parallel-ATA, small computer system interface (SCSI), enhanced small disk interface (ESDI), integrated drive electronics (IDE), Firewire, universal flash storage (UFS), and nonvolatile memory express (NVMe). In an embodiment, a write command defined by the above-described standards may include size information of the write data.

The nonvolatile memory 1200 may be implemented with a variety of nonvolatile memory devices, such as, (but not limited to), an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 1100 or the nonvolatile memory device 1200 may be integrated in a single semiconductor device. In an embodiment, the memory controller 1100 or the nonvolatile memory 1200 may be integrated in a single semiconductor device to form a solid state drive (SSD). The memory controller 1100 or the nonvolatile memory device 1200 may be integrated in a single semiconductor device to constitute a memory card. For example, the memory controller 1100 or the nonvolatile memory device 1200 may be integrated in a single semiconductor device to form a memory card such as, (but not limited to), a PC card (e.g., a personal computer memory card international association (PCMCIA) card), a compact flash card (CF), a smart media card (e.g., SM, or SMC), a memory stick, a multimedia card (e.g., MMC, RS-MMC, MMCmicro, or eMMC), an SD card (e.g., SD, miniSD, microSD, or SDHC), and a universal flash storage (UFS).

Figure 15:
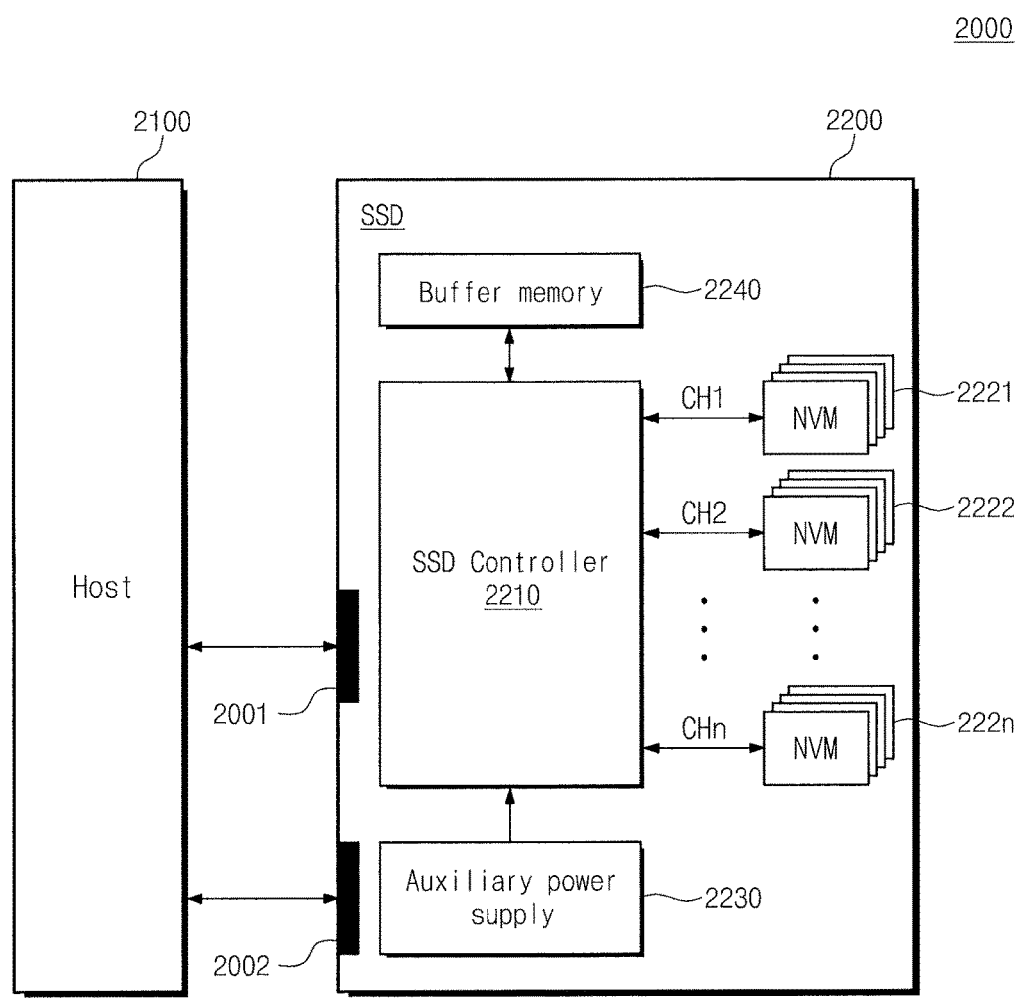
FIG. 15 is a schematic view of a solid state drive system including a nonvolatile memory device, according to an embodiment of the inventive concept.

FIG. 15 is a schematic view of a solid state drive system including a nonvolatile memory device, according to an embodiment of the inventive concept. Referring to FIG. 15, the solid state drive (SSD) system 2000 includes a host 2100 and an SSD 2200. The SSD 2200 may exchange signals with the host 2100 through a signal connector 2001 and may be supplied with electric power through a power connector 2002. The SSD 2200 includes an SSD controller 2210, a plurality of nonvolatile memory devices 2221 to 222n, an auxiliary power supply 2230, and a buffer memory 2240. The SSD controller 2210 may control the nonvolatile memory devices 2221 to 222n in response to the signal from the host 2100.

The auxiliary power supply 2230 is connected to the host 2100 through the power connector 2002. The auxiliary power supply 2230 may be charged by electric power from the host 2100. When the electric power is not smoothly supplied from the host 2100, the auxiliary power supply 2230 may power the SSD system 2000. For example, the auxiliary power supply may have excessive ripple or noise. The auxiliary power supply 2230 may be placed inside or outside the SSD 2200. For example, the auxiliary power supply 2230 may be mounted on a main circuit board to supply auxiliary electric power to the SSD 2200. In one embodiment, the host 2100 and the SSD 2200 are attached to the main board.

The buffer memory 2240 operates as a buffer memory of the SSD 2200. For example, the buffer memory 2240 may temporarily store data received from the host 2100 or from the nonvolatile memory devices 2221 to 222n or may temporarily store metadata (e.g., mapping tables) of the nonvolatile memory devices 2221 to 222n. The buffer memory 2240 may include volatile memories such as a DRAM, and a static RAM (SRAM) or nonvolatile memories such as a FRAM a ReRAM, a STT-MRAM, and a PRAM.

Figure 16:
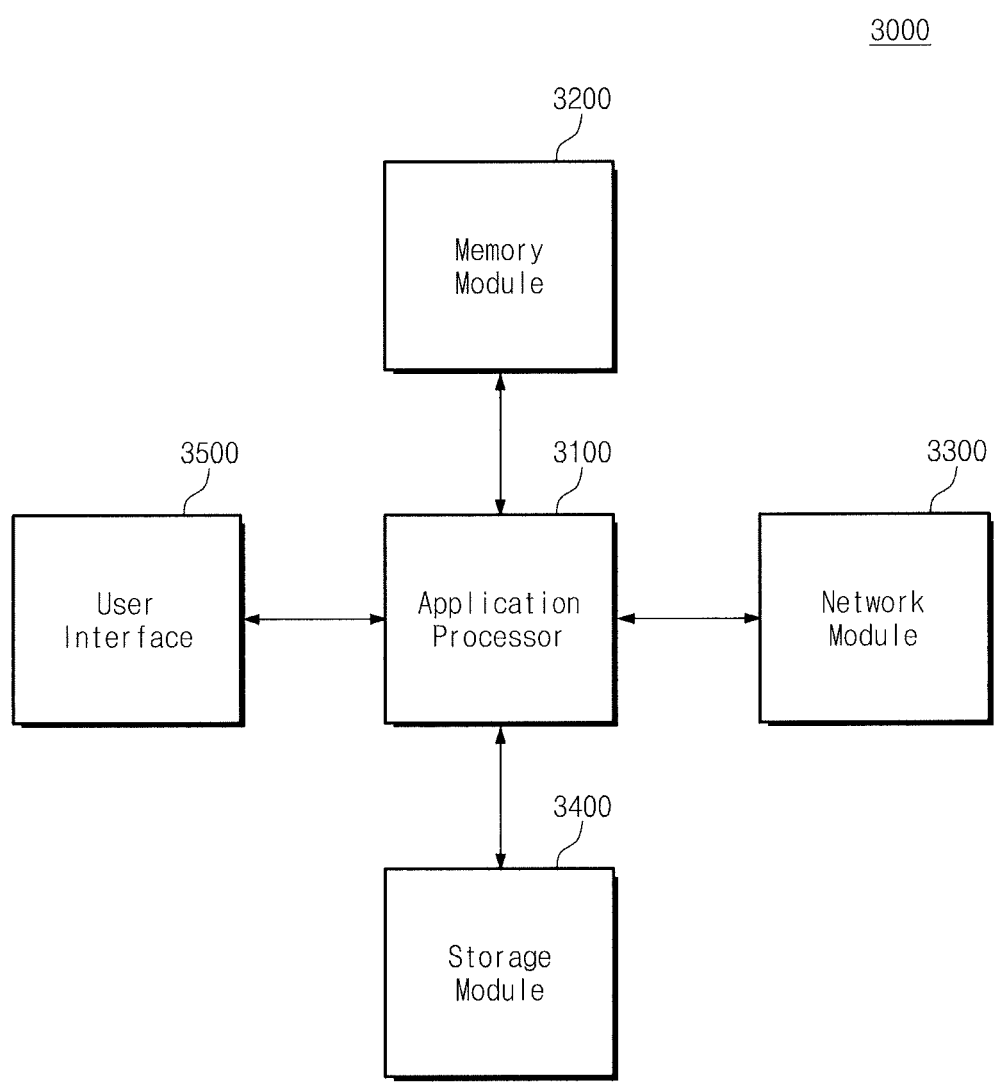
FIG. 16 is a schematic view of a user system applying a nonvolatile memory device according to an embodiment of the inventive concept.

FIG. 16 is a schematic view of a user system applying a nonvolatile memory device according to an embodiment of the inventive concept. Referring to FIG. 16, the user system 3000 may include an application processor 3100, a memory module 3200, a network module 3300, a storage module 3400, and a user interface 3500.

The application processor 3100 may drive elements, (e.g., an operating system) of the user system 3000. In an embodiment, the application processor 3100 may include controllers for controlling elements of the user system 3000, graphics engines, or a variety of interfaces. The application processor 3100 may be included in a system-on-chip (SoC) package.

The memory module 3200 may operate as a main memory, a working memory, a buffer memory, or a cache memory of the user system 3000. The buffer memory 3200 may include volatile memories such as a DRAM and an SRAM, or nonvolatile memories such as a FRAM a ReRAM, an MRAM, and a PRAM.

The network module 3300 may communicate with external devices. For example, the network module 3300 may support wireless communications, such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless LAN (WLAN), ultra wide band (UWB), Bluetooth, and wireless display (WI-DI). In an embodiment, the network module 3300 may be included in the application processor 3100.

The storage module 3400 may store data. For example, the storage module 3400 may store data received from the application processor 3100. Alternatively, the storage module 3400 may provide the application processor 3100 with data stored therein. In an embodiment, the storage module 3400 may be implemented with nonvolatile semiconductor memory devices such as an EEPROM, a NAND flash memory, a NOR flash memory, a PRAM, a ReRAM, a FeRAM, and an STT-MRAM.

The user interface 3500 may include interfaces, which input data or a command to the application processor 3100 or output data to an external device. For example, the user interface 3500 may include user input interfaces such as a keyboard, a keypad, buttons, a touch panel, a touch screen, a touch pad, a touch ball, a camera, a microphone, a gyroscope sensor, and a vibration sensor. The user interface 3500 may further include user output interfaces such as a liquid crystal display (LCD), an organic light-emitting diode (OLED) display device, an active matrix OLED (AMOLED) display device, a light-emitting diode (LED), a speaker, and a motor.

A nonvolatile memory device, a card controller, and a memory card according to embodiments of the inventive concept may be packaged according to any of a variety of different packaging technologies. For example, a flash memory device and/or a memory controller according to an embodiment of the inventive concept may be packaged by using packages such as Package on Package (PoP), Chip Scale Package (CSP), Plastic Dual in Line Package (PDIP), Ceramic Dual in Line Package (CERDIP), Thin Quad Flat Package (TQFP), Shrink Small Outline Package (SSOP), Thin Small Outline Package (TSOP), Wafer-level Fabricated Package (WFP), and Wafer-level Processed Stack Package (WSP).

According to an embodiment of the inventive concept, a nonvolatile memory device may respectively control an operation of a randomizer or an error correction circuit according to segments in a page during a program operation or a read operation, thereby improving an operating speed and reducing power consumption.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. A nonvolatile memory device comprising:
   a memory cell array including a plurality of first segments having a write data, and a plurality of second segments having information indicating whether each of the plurality of first segments is programmed;
   a randomizer configured to randomize the write data;
   an error correction circuit configured to perform an error correction operation on the write data;
   a control logic configured to determine the information from an address received from a memory controller, and to determine whether to operate the randomizer and the error correction circuit based on the determination of the information during a program operation; and
   a page buffer configured to store the write data and the information during the randomizing and the error correction operation.

2. The nonvolatile memory device of claim 1, wherein each of the plurality of first segments and the plurality of second segments includes memory cells connected to at least one bit line.

3. The nonvolatile memory device of claim 1, wherein the control logic comprises:
   an address check circuit configured to check whether the plurality of first segments is programmed, based on the address; and
   a register configured to store a result of the address check circuit.

4. The nonvolatile memory device of claim 1, wherein during a read operation, the page buffer sends the information in the plurality of second segments to the control logic, the control logic stores the information sent from the page buffer and determines whether to operate the error correction circuit and the randomizer based on the information, the error correction circuit performs an error correction operation on a read data retrieved from the plurality of first segments in response to a first command from the control logic, and the randomizer performs a de-randomization operation with respect to the read data corrected by the error correction circuit in response to a second command from the control logic.

5. The nonvolatile memory device of claim 4, wherein the control logic comprises:
   an address check circuit configured to check whether each of the plurality of first segments is programmed, based on the address;
   a first register configured to store the results of the address check circuit; and
   a second register configured to store the information sent from the page buffer.

6. The nonvolatile memory device of claim 5, wherein the control logic further comprises a selection circuit selecting one of a first output of the first register and a second output of the second register.

7. A nonvolatile memory device comprising:
   a memory cell array including a plurality of first segments having write data, and a plurality of second segments having information indicating whether each of the plurality of first segments is programmed; and
   a control logic configured to:
   receive an address from a memory controller;
   determine whether a randomization operation is performed on the write data in units of a first segment based on the address during a program operation; and
   determine whether a de-randomization operation is performed on a read data retrieved from the plurality of first segments in units of the first segment based on the information of the plurality of second segments during a read operation.

8. The nonvolatile memory device of claim 7, wherein each of the plurality of first segments and the plurality of second segments includes memory cells connected to at least one bit line.

9. The nonvolatile memory device of claim 7, further comprising:
   a randomizer configured to perform the randomization operation on the write data and perform the de-randomization operation on the read data from the plurality of first segments.

10. The nonvolatile memory device of claim 9, further comprising:
    a page buffer configured to store randomized data from the randomization operation during the program operation or to store de-randomized data from the de-randomization operation during the read operation.

11. The nonvolatile memory device of claim 7, wherein the control logic is further configured to:
    determines whether an error correction operation is performed on the write data in units of the first segment based on the address during the program operation; and
    determine whether an error correction operation is performed on the read data from the plurality of first segments in units of the first segment based on the information of the plurality of second segments during the read operation.

12. The nonvolatile memory device of claim 11, further comprising:
    a randomizer configured to perform the randomization operation on the write data; and
    an error correction circuit configured to perform the error correction operation on the write data that was randomized during the program operation,
    wherein during the read operation, the error correction circuit performs the error correction operation on the read data retrieved from the plurality of first segments and the randomizer performs the de-randomization operation on the read data that was error-corrected.

13. The nonvolatile memory device of claim 12, further comprising:
    a page buffer configured to store the write data for error correction and randomization during the program operation and to store the read data for de-randomization and error correction during the read operation.

14. The nonvolatile memory device of claim 13, wherein the control logic comprises:
   an address check circuit configured to check whether each of the plurality of first segments is programmed, based on the address during the program operation;
   a first register configured to store the results of the address check; and
   a second register configured to store the read data from the page buffer.

15. The nonvolatile memory device of claim 14, wherein the control logic further comprises a selection circuit selecting one of a first output of the first register and a second output of the second register.

16. A nonvolatile memory device comprising:
   a memory cell array including a plurality of first segments having write data, and a plurality of second segments having information indicating whether each of the plurality of first segments is programmed; and
   a control logic configured to:
   receive an address from a memory controller;
   determine whether an error correction operation is performed on the write data in units of a first segment based on the address during a program operation; and
   determine whether an error correction operation is performed on a read data retrieved from the plurality of first segments in units of the first segment based on the information of the plurality of second segments during a read operation.

17. The nonvolatile memory device of claim 16, further comprising:
   a randomizer configured to perform a randomization operation on the write data and perform a de-randomization operation on the read data from the plurality of first segments; and
   an error correction circuit configured to perform the error correction operation on the write data that was randomized by the randomization operation during the program operation, wherein during the read operation, the error correction circuit performs the error correction operation on the read data retrieved from the plurality of first segments and the randomizer performs the de-randomization operation on the read data that was error-corrected.

18. The nonvolatile memory device of claim 17, further comprising:
   a page buffer configured to store the write data for the error correction during the program operation and to store the read data for the error correction during the read operation.

19. The nonvolatile memory device of claim 17, wherein the control logic is further configured to:
   determine whether a randomization operation is performed on the write data in units of the first segment, based on the address during the program operation; and
   determine whether a de-randomization operation is performed on the read data retrieved from the plurality of first segments in units of the first segment, based on the information of the plurality of second segments during the read operation.

* * * * *